US011327770B2

(12) United States Patent
Wu

(10) Patent No.: US 11,327,770 B2
(45) Date of Patent: May 10, 2022

(54) DATA STORAGE DEVICES, ACCESS DEVICE AND DATA PROCESSING METHODS

(71) Applicant: Silicon Motion, Inc., Jhubei (TW)

(72) Inventor: Po-Wei Wu, Keelung (TW)

(73) Assignee: Silicon Motion, Inc., Hsinchu County (TW)

( * ) Notice: Subject to any disclaimer, the term of this patent is extended or adjusted under 35 U.S.C. 154(b) by 237 days.

(21) Appl. No.: 16/721,887

(22) Filed: Dec. 19, 2019

(65) Prior Publication Data

US 2020/0210202 A1 Jul. 2, 2020

(30) Foreign Application Priority Data

Jan. 2, 2019 (TW) .................................. 108100034

(51) Int. Cl.
*G06F 9/4401* (2018.01)
*G11C 29/38* (2006.01)

(52) U.S. Cl.
CPC ............ *G06F 9/4403* (2013.01); *G11C 29/38* (2013.01)

(58) Field of Classification Search
None
See application file for complete search history.

(56) References Cited

U.S. PATENT DOCUMENTS

| 10,073,651 B2 * | 9/2018 | Lee ........................ G06F 3/0619 |
| 10,102,081 B2 * | 10/2018 | Wu ........................ G06F 3/0688 |
| 2007/0266202 A1 * | 11/2007 | Mukaida ............. G06F 11/1068 711/103 |
| 2009/0222689 A1 * | 9/2009 | Patel ...................... G11C 29/74 714/6.11 |
| 2011/0238629 A1 * | 9/2011 | Post .................... G06F 12/0246 707/674 |
| 2012/0246384 A1 * | 9/2012 | Lin ...................... G06F 11/1417 711/103 |
| 2014/0250295 A1 * | 9/2014 | Briden .................. G06F 9/4401 713/2 |
| 2018/0173536 A1 * | 6/2018 | Sela ........................ G06F 9/441 |

* cited by examiner

*Primary Examiner* — April Y Blair
*Assistant Examiner* — Matthew W Wahlin
(74) *Attorney, Agent, or Firm* — Winston Hsu

(57) ABSTRACT

An access device includes a memory controller coupled to a memory device and configured to access the memory device. The memory controller is further configured to perform a test procedure on the memory device to obtain a test result, write a boot code index, which indicates a predetermined address for storing predetermined system data of the memory device and a copy rule adopted for generating one or more duplicates of the predetermined system data, in the memory device, establish system data of the memory device according to the test result, write the system data into the predetermined address as the predetermined system data, and write the system data in one or more memory blocks of the memory device as the duplicates of the predetermined system data according to the copy rule.

9 Claims, 4 Drawing Sheets

DATA STORAGE DEVICES, ACCESS DEVICE AND DATA PROCESSING METHODS

CROSS REFERENCE TO RELATED APPLICATIONS

This application claims priority of Taiwan Patent Application No. 108100034, filed on Jan. 2, 2019, the entirety of which is incorporated by reference herein.

BACKGROUND OF THE INVENTION

Field of the Invention

The invention relates to a data processing method for a memory device, which is capable of solving the problem with the conventional design wherein system data stored in the memory device cannot be successfully accessed after the memory device has undergone a high-temperature bonding procedure.

Description of the Related Art

With the rapid growth of data storage technology in recent years, many data storage devices—such as memory cards manufactured in compliance with the SD/MMC standards, CF standards, MS standards or XD standards, as well as solid state hard drives, Embedded Multi Media Cards (eMMC) and Universal Flash Storage (UFS)—have been used widely for a variety of purposes. Therefore, effective control of access to these data storage devices is an important issue.

In order to improve the access performance of the data storage device, a novel data processing method is proposed which is capable of solving the problem in the conventional design that the system data stored in the memory device cannot be successfully accessed after it has undergone a high-temperature bonding procedure.

BRIEF SUMMARY OF THE INVENTION

A data storage device, an access device and a data processing method are provided. An exemplary embodiment of a data storage device comprises a memory device and a memory controller. The memory device comprises a plurality of memory blocks. The memory controller is coupled to the memory device and configured to access the memory device. The memory controller is configured to perform an initialization procedure to initialize the memory device. In the initialization procedure, the memory controller is configured to read a boot code index stored in the memory device and to try to read predetermined system data from a predetermined address indicated by the boot code index. When the memory controller is unable to successfully read the predetermined system data from the predetermined address, the memory controller is further configured to perform a duplicate obtaining procedure to obtain system data that is complete and correct from one or more duplicates of the predetermined system data. The boot code index is further utilized to indicate a copy rule. The memory controller is further configured to determine addresses of the memory device for storing the duplicates of the predetermined system data according to the copy rule and/or the predetermined address, and read the duplicates of the predetermined system data to obtain the system data that is complete and correct.

An exemplary embodiment of an access device comprises a memory controller coupled to a memory device and configured to access the memory device. The memory controller is configured to perform a test procedure on the memory device to obtain a test result, and configured to write a boot code index, which indicates a predetermined address for storing predetermined system data of the memory device and a copy rule adopted for generating one or more duplicates of the predetermined system data, in the memory device. The memory controller is further configured to establish system data of the memory device according to the test result, write the system data into the predetermined address as the predetermined system data, and store the system data in one or more memory blocks of the memory device as duplicates of the predetermined system data according to the copy rule.

An exemplary embodiment of a data processing method for processing data of a memory device comprises the following steps performed by a first memory controller: performing a test procedure on the memory device to obtain a test result; writing a boot code index in the memory device, wherein the boot code index indicates a predetermined address for storing predetermined system data of the memory device and a copy rule adopted for generating one or more duplicates of the predetermined system data; establishing system data of the memory device according to the test result; writing the system data into the predetermined address as the predetermined system data; and storing the system data in one or more memory blocks of the memory device as duplicates of the predetermined system data according to the copy rule.

A detailed description is given in the following embodiments with reference to the accompanying drawings.

BRIEF DESCRIPTION OF DRAWINGS

The invention can be more fully understood by reading the subsequent detailed description and examples with references made to the accompanying drawings, wherein.

DETAILED DESCRIPTION OF THE INVENTION

In order to make the objects, features and advantages of the invention more comprehensible, specific embodiments of the invention are set forth in the accompanying drawings. This description is made for the purpose of illustrating the general principles of the invention and should not be taken in a limiting sense. It should be understood that the following embodiments can be implemented by software, hardware, firmware, or any combination thereof. The scope of the invention is determined by reference to the appended claims.

Figure 1:
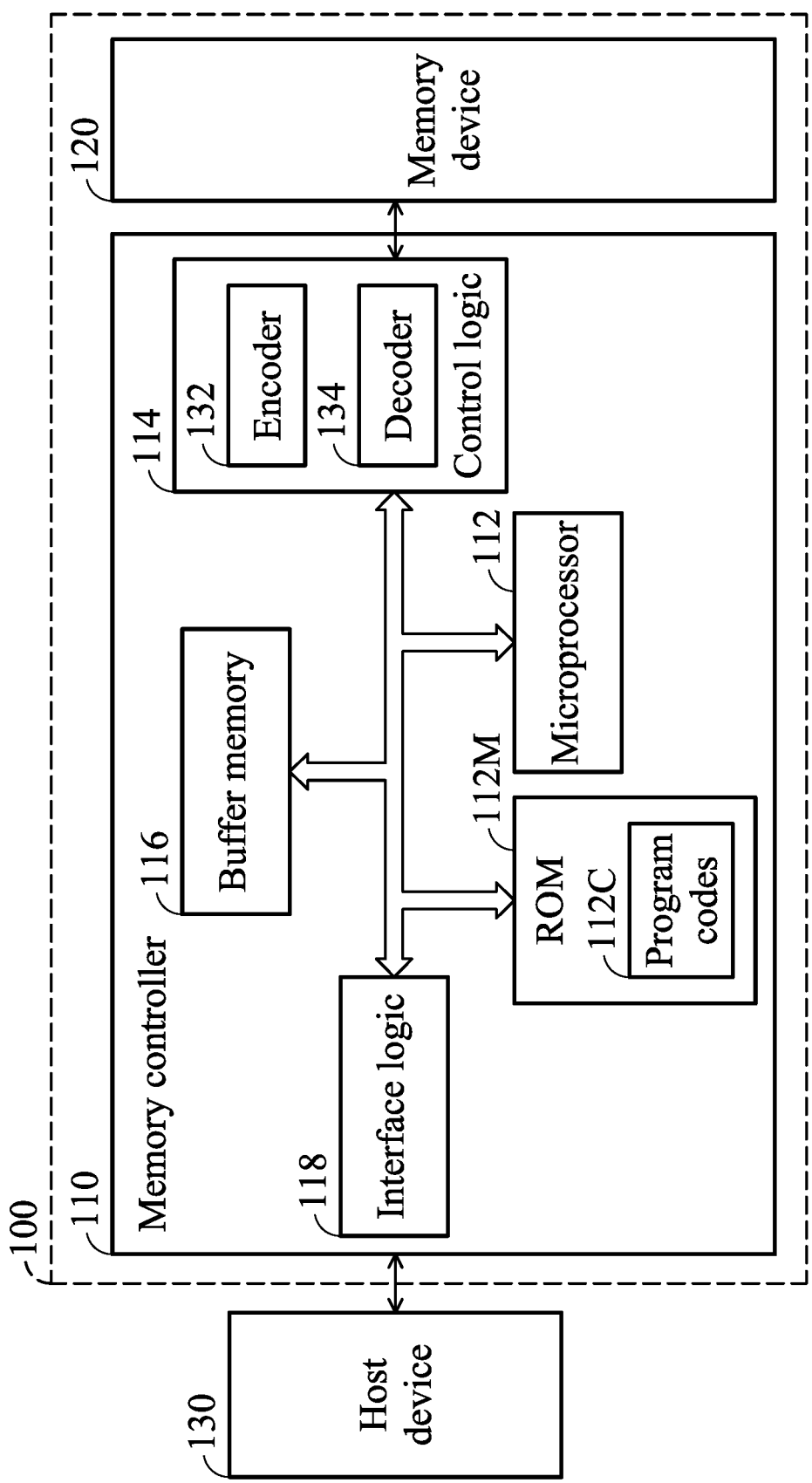
FIG. 1 shows an exemplary block diagram of a data storage device according to an embodiment of the invention.

FIG. 1 shows an exemplary block diagram of a data storage device according to an embodiment of the invention. The data storage device 100 may comprise a memory device 120, such as a flash memory module, and a memory controller 110. The memory controller 110 is configured to access the memory device 120. According to an embodiment of the invention, the memory controller 110 may comprise a microprocessor 112, a Read Only Memory (ROM) 112M, a control logic 114, a buffer memory 116 and an interface logic 118. The ROM 112M is configured to store program codes 112C. The microprocessor 112 is configured to execute the program codes 112C, thereby controlling access to the memory device 120. The control logic 114 may comprise an encoder 132 and a decoder 134. The encoder 132 is configured to encode the data to be written into the memory device 120 so as to generate corresponding correcting/checking code (also called error correction code (ECC)). The decoder 134 is configured decode the data read out from the memory device 120.

Typically, the memory device 120 may comprise a plurality of flash memory chips, and each flash memory chip may comprise a plurality of memory blocks. The access unit of an erase operation performed by the controller (e.g., the memory controller 110, through the execution of the program codes 112C by the microprocessor 112) on the memory device 120 may be one memory block. In addition, a memory block may record (comprise) a predetermined number of pages, that is, the physical pages, and the access unit of a write operation performed by the controller (e.g., the memory controller 110, through the execution of the program codes 112C by the microprocessor 112) on the memory device 120 may be one page.

In practice, the memory controller 110 may perform various control operations by using its own internal components through the execution of the program codes 112C by the microprocessor 112. For example, the memory controller 110 may use the control logic 114 to control the access operations (especially the access operation for at least a memory block or at least a page) of the memory device 120, use the buffer memory 116 to perform necessary data buffer operations, and use the interface logic 118 to communicate with a host device 130. The buffer memory 116 may be implemented by a Random Access Memory (RAM). For example, the buffer memory 116 may be an SRAM, but the invention should not be limited thereto.

In an embodiment of the invention, the data storage device 100 may be a portable storage device (for example, the memory card in compliance with the SD/MMC, CF, MS and/or XD standard), and the host device 130 may be an electronic device, such as a mobile phone, a notebook computer, a desktop computer . . . etc., capable of connecting to the data storage device. In another embodiment of the invention, the data storage device 100 may be a solid state hard disk or an embedded storage device in compliance with the Universal Flash Storage (UFS) or the Embedded Multi Media Card (EMMC) standards, and may be equipped in an electronic device such as a mobile phone, a notebook computer, or a desktop computer. In such an embodiment, the host device 130 may be a processor of the electronic device.

In yet another embodiment of the invention, the data storage device 100 may be a specialized access device comprising a memory controller and one or more sockets (not shown in the figure). In this manner, the memory device 120 can be installed in the data storage device 110 in a removable manner, and the host device 130 may be an electronic device, such as a mobile phone, a notebook computer, a desktop computer . . . etc., capable of connecting to the data storage device. In the embodiments of the invention, the specialized access device may be utilized to perform product test on one or more memory devices at the same time. Via the product test, information regarding the number of good and bad memory blocks of each memory device can be obtained and the quality of the memory device can be determined. The memory devices can be classified and configured according to the corresponding quality.

The host device 130 may issue commands, such as the read command or the write command, to the data storage device 100, so as to access the data stored in the memory device 120, or the host device 130 may issue commands to further control or manage the data storage device 100.

According to an embodiment of the invention, the memory blocks comprised in the memory device 120 may be configured as the Single-Level Cell (SLC) memory blocks, the Multiple-Level Cell (MLC) memory blocks and/or the Triple-Level Cell (TLC) memory blocks. The memory cell of the SLC memory block is configured to store one bit data, the memory cell of the MLC memory block is configured to store two bits data, and the memory cell of the TLC memory block is configured to store three bits data.

Figure 2:
FIG. 2 is a schematic diagram showing the three stages for manufacturing a memory product according to an embodiment of the invention.

According to an embodiment of the invention, when making a memory device (e.g. the memory device 120) into a specific memory product, the memory device 120 may undergo three stages, comprising a test and classification stage, a bonding stage and an initialization stage. FIG. 2 is a schematic diagram showing the three stages for manufacturing a memory product according to an embodiment of the invention. According to an embodiment of the invention, the memory device 120 may be coupled to different memory controller in the test and classification stage and the initialization stage. For example, in the test and classification stage, the memory controller 120 may be coupled to a first memory controller. The first memory controller may be the memory controller comprised in the afore-mentioned specialized access device, and at this time, the first memory controller and the memory device 120 coupled to the first memory controller may be as a whole regarded as a data storage device, such as the afore-mentioned data storage device 100. When the test and classification stage is finished, the memory device 120 may be removed from the specialized access device. Another memory device may then be coupled to the first memory controller when needed, so as to perform the test and classification on the next memory device via the first memory controller. Testing and classification can be repeatedly performed on different memory devices.

In the test and classification stage, the first memory controller may perform the read/write test multiple times on the memory device 120 coupled thereto, so as to determine which memory blocks are damaged, which memory blocks are good and available, calculate the actual usable capability of the memory device 120 as the size of the memory device 120, determine the quality of the memory device 120 according to the damage rate of the memory blocks and classify the memory device 120 according to the quality of the memory device 120 (for example, determining whether the memory device 120 will be manufactured as a USB 2.0 product, a USB 3.0 product, an SSD product, or others), and set the corresponding memory configuration for the memory device 120 according to the quality thereof (for example, which kind of operation should be adopted (such as the one-plane operation, two-plane operation, four-plane operation, etc.), whether the memory device 120 should be operated in a reliable mode or an unreliable mode, which memory blocks should be configured as the memory blocks for storing system data, which memory blocks should be configured as the memory blocks for storing system data, etc.). The afore-mentioned configuration and information regarding the settings of the memory device are the essential information required for accessing the memory device 120 subsequently. Therefore, in the test and classification stage, the first memory controller may obtain the information regarding the size of the memory device 120 and essential information required for accessing the memory device 120, record the information as the system data of the memory device 120, and write the system data into the memory device 120.

After the test and classification stage is finished, the memory device 120 can be removed from the access device and then the memory device 120 may be coupled to a corresponding second memory device based on the classification result. For example, when the memory device 120 is determined to be manufactured as a USB 3.0 product in the test and classification stage, the memory device 120 may then be coupled to a USB 3.0 memory controller. In the bonding stage, the memory device 120 and the second memory controller are bonded to the printed circuit board (PCB). For example, being bonded to the PCB by using surface mounting technology (SMT). The second memory controller and the memory device 120 coupled thereto may be as a whole regarded as another data storage device, for example, another data storage device 100. Next, an initialization stage of the memory device 120 can be entered. In the initialization stage, an initialization procedure is performed. In the initialization procedure, the second memory controller has to read the afore-mentioned system data, so as to obtain the information regarding the size of the memory device 120 and essential information required for accessing the memory device 120, and the second memory controller can perform some other necessary initialization operations on the memory device 120 according to the obtained information. Note that the necessary initialization operations may be different for different types of memory products. For example, when the system data of the memory device 120 is written to the memory device 120 in a first format in compliance with a first standard in the test and classification stage and the data format required by the final product that is to be made up of the memory device 120 is a second format in compliance with a second standard, and the first format is different from the second format, the second memory controller has to convert the data format of the obtained system data. After the data format conversion, the content of the system data can be recognized.

It should be noted that since in the embodiments of the invention, the first memory controller and the second memory controller may have substantially the same design, or have similar design, and the difference is only in the content of the program codes 112C, the interface logic to communicate with the memory device, the corresponding In-System Programming (ISP) codes, etc. Therefore, the structure of the first memory controller and the second memory controller (and the corresponding access device or data storage device) may refer to the block diagram shown in FIG. 1. However, it is to be understood that those who are skilled in this technology can still make various alterations and modifications on the hardware design of the memory controller shown in FIG. 1. Therefore, the structure and components comprised in the first memory controller and the second memory controller in practice should not be limited to what is shown in FIG. 1.

As discussed above, since the memory device may have undergone a high-temperature bonding procedure for being bonded to the PCB in the bonding stage, the system data stored in the memory device 120 may be damaged or lost, which may further cause the problem that the second memory controller is unable to obtain the system data. To solve this problem, a data processing method and the corresponding data storage device and access device implementing the data processing method are provided. Via the special data processing performed by the first memory controller in the test and classification stage, it can ensure that the second memory controller is able to obtain system data that is complete and correct in the initialization stage.

Figure 3:
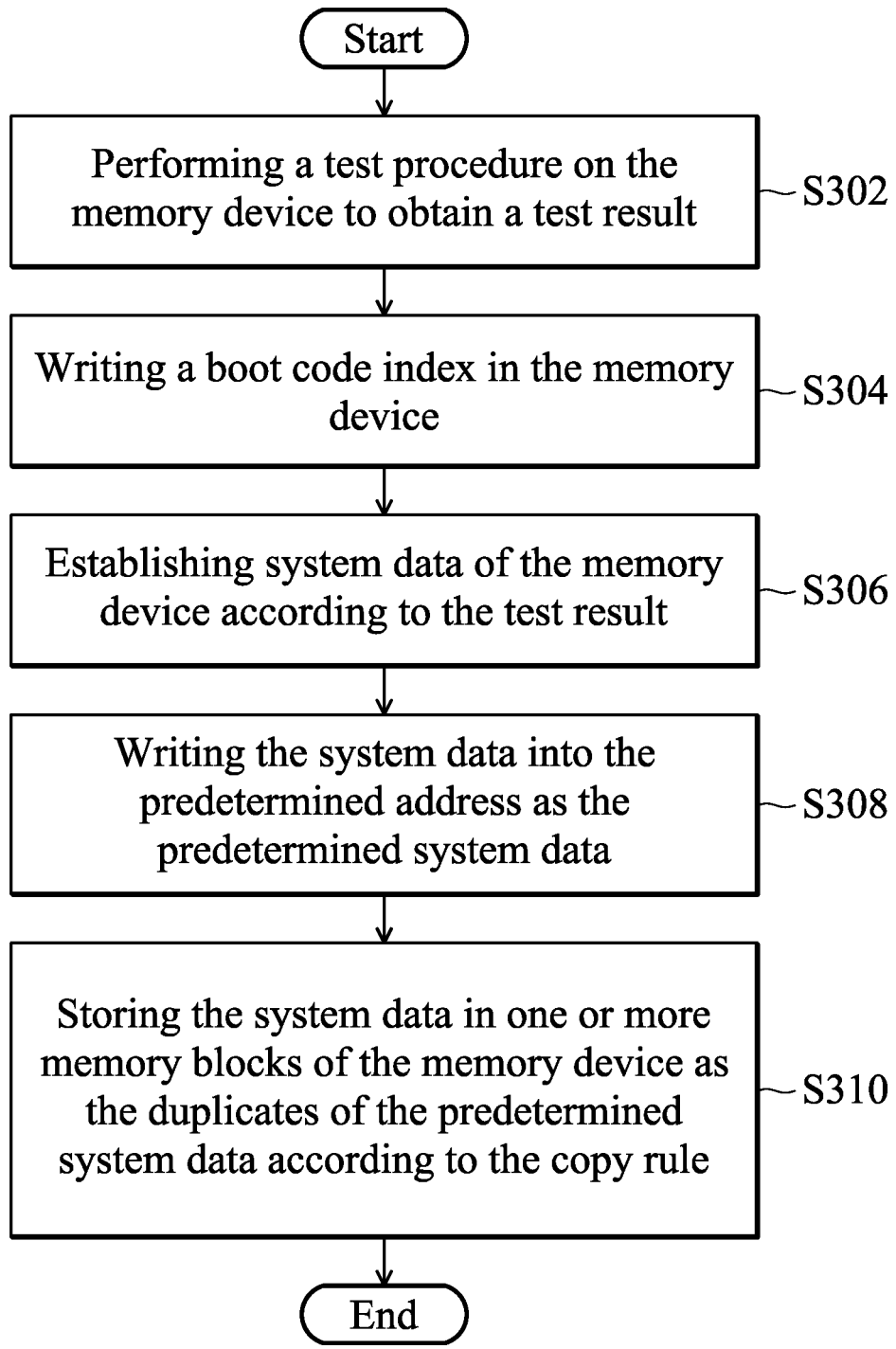
FIG. 3 is a flow chart of a data processing method according to an embodiment of the invention.

The proposed data processing method may be substantially divided into two parts, which are respectively corresponding to the aforementioned test and classification stage and the initialization stage. FIG. 3 is a flow chart of a data processing method according to an embodiment of the invention. In FIG. 3, the first portion of the proposed data processing method is shown. The memory device is first coupled to the first memory controller and the test and classification stage is entered. In the test and classification stage, the first memory controller is configured to perform a test procedure on the memory device to obtain a test result (Step S302). Next, the first memory controller is configured to write a boot code index in the memory device (Step S304). According to an embodiment of the invention, the boot code index may be limited only to be stored in a specific memory area of the memory device. In addition, according to an embodiment of the invention, the first memory controller may determine to store the system data in which position (address) as the predetermined system data and determine to adopt which copy rule for copying the system data as one or more duplicates of the predetermined system data. The content of the boot code index indicates a predetermined address for storing the predetermined system data and the copy rule adopted for generating duplicates of the predetermined system data.

Next, the first memory controller is configured to establish the system data of the memory device according to the test result (Step S306), and write the system data into the predetermined address as the predetermined system data (Step S308). As discussed above, the system data comprises information regarding the size of the memory device and essential information required for accessing the memory device. In addition, according to an embodiment of the invention, the first memory controller is further configured to write (or, store) the system data in one or more memory blocks of the memory device as duplicates of the predetermined system data according to the copy rule (Step S310).

Figure 4:
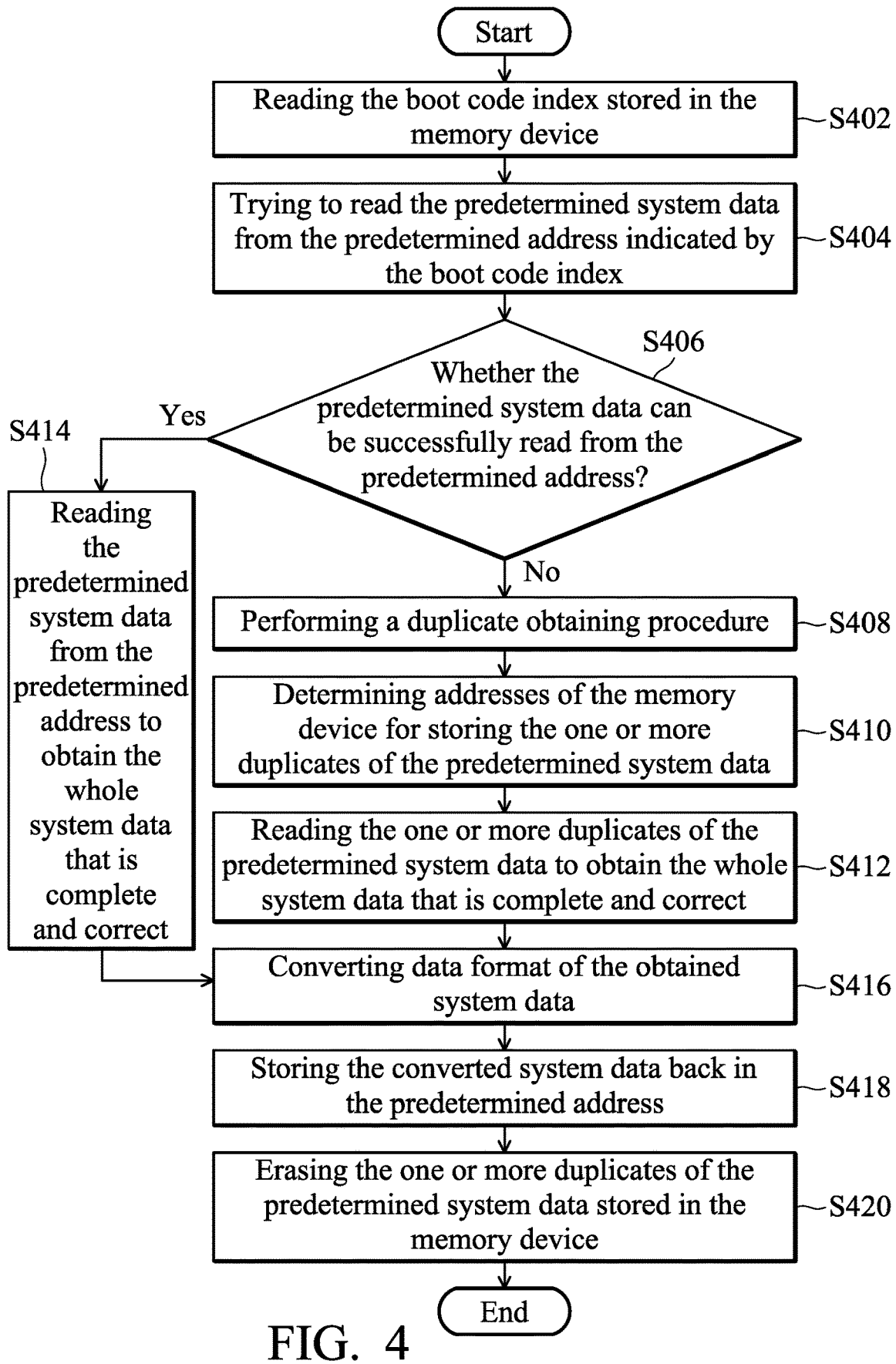
FIG. 4 is a flow chart of a data processing method according to an embodiment of the invention.

FIG. 4 is a flow chart of a data processing method according to an embodiment of the invention. In FIG. 4, the second portion of the proposed data processing method is shown. That is, the flow chart of the proposed data processing method in the initialization stage subsequent to the test and classification stage. As discussed above, when the test and classification stage is finished, the first memory controller is de-coupled from the memory device, and the second memory controller is coupled to the memory device. The second memory controller is the corresponding controller of the final memory product that will comprise the memory device. First of all, the second memory controller is configured to read the boot code index stored in the memory device (Step S402). As discussed above, the boot code index may be limited to only be stored in a specific memory area. Therefore, the second memory controller may try to find out where the boot code index is in this specific memory area, so as to obtain the information regarding the predetermined address for storing predetermined system data of the memory device and the copy rule adopted for generating one or more duplicates of the predetermined system data. Next, the second memory controller is configured to try to read the predetermined system data from the predetermined address indicated by the boot code index to obtain system data that is complete and correct (Step S404). The second memory controller may further determine whether the predetermined system data can be successfully read from the predetermined address (Step S406). For example, the second memory controller may determine whether the predetermined system data can be successfully read from the predetermined address based on whether the content of the header of the data stored in the predetermined address can be read successfully. When the second memory controller cannot successfully read the content of the header, it is determined that the second memory controller is also unable to successfully read the content of the predetermined system data from the predetermined address.

When the second memory controller is able to successfully read the content of the predetermined system data, the second memory controller may read the predetermined system data from the predetermined address to obtain system data that is complete and correct (Step S414). When the second memory controller is unable to successfully read the content of the predetermined system data, the second memory controller may perform a duplicate obtaining procedure (Step S408) to obtain system data that is complete and correct from one or more duplicates of the predetermined system data. The second memory controller may determine addresses of the memory device for storing the duplicates of the predetermined system data (Step S410) according to the copy rule and/or the predetermined address indicated by the boot code index. Next, the second memory controller may read the duplicates of the predetermined system data to obtain system data that is complete and correct (Step S412).

Next, after obtaining system data that is complete and correct from the duplicates of the predetermined system data, or after obtaining system data that is complete and correct from the predetermined address in step S414, the second memory controller may convert the data format of the obtained system data (Step S416), store the converted system data back in the predetermined address (Step S418) and erase the duplicates of the predetermined system data stored in the memory device (Step S420). That is, in the embodiment of the invention, only the system data stored in the predetermined address is preserved, and the duplicates or copies of the system data will be erased. It should be noted that the format conversion step (step S416) is an optional choice. When the data format required by the final product that is to be made up of the memory device 120 will be the same as the one used in the test and classification stage, the step can be skipped.

In the embodiments of the invention, the first memory controller is not limited to only store the duplicates of the predetermined system data in the memory blocks that are configured for storing system data. The first memory controller may also store the duplicates of the predetermined system data in the memory blocks that are configured for storing user data. Since the duplicates of the predetermined system data will finally be deleted (for example, being erased in step S420), in the embodiments of the invention, the first memory controller may store the duplicates of the predetermined system data in the memory blocks that are configured for storing user data, and this will not cause the user problems with insufficient available memory space.

In addition, according to an embodiment of the invention, the first memory controller may select a proper copy rule from a group of predefined copy rules for generating duplicates of the predetermined system data. According to an embodiment of the invention, the way to copy the system data may be mainly divided into two types, including a first type: to store or copy all of the system data in one memory block and a second type: to store or copy only one page of the system data in one memory block.

To be more specific, according to the way to copy system data of the first type, all of the system data will be stored in one memory block. For example, suppose that the system data comprises N pages of data, the first memory controller may select M memory blocks and store the N pages of complete system data in each selected memory block, wherein N and M are positive integers.

According to the way to copy system data of the second type, one memory block may be utilized to store the content of one predetermined page of the system data, and a plurality of pages comprised in this memory block will all be written with the same content of the predetermined page. For example, suppose that the system data comprises N pages of data, wherein N is a positive integer, the first memory controller may select M memory blocks, and different memory blocks may be utilized to store different pages of the system data, wherein M is a positive integer greater than or equal to N. For example, some or all of the pages comprised in a first memory block may be utilized to store the content of the first page of the system data, a plurality of pages or all pages comprised in a second memory block may be utilized to store the content of the second page of the system data, and so on.

In addition, according to an embodiment of the invention, the first memory controller may also select the memory blocks utilized to store the duplicates according to a variety of different rules. For example, the first memory controller may select the memory blocks determined as having good quality to store the duplicates. In addition, for example, since the memory blocks determined as having good quality are usually configured as the memory blocks for storing the system data, the first memory controller may select the memory blocks utilized configured for storing the system data to store the duplicates of the system data.

In another example, the first memory controller may set a cardinal number n, where n is a positive integer, and the first memory controller may select the memory blocks having a corresponding memory block number (or, index) as a multiple of n as the memory blocks for storing the duplicates of the system data. In other words, in this embodiment, the duplicates of the system data may be stored in the memory device based on a fixed data density.

In another example, the duplicates of the system data may also be in the memory device according to different data densities. For example, the first memory controller may select more memory blocks in the memory area having good quality, and select fewer memory blocks in the memory area having poor quality to store the duplicates of the system data. In other words, the memory area having good quality may be utilized to store the duplicates of the system data with higher data density, and the memory area having poor quality may be utilized to store the duplicates of the system data with lower data density. In the embodiment of the invention, the quality of the memory area may be determined in the aforementioned test stage or may be predetermined according to the previous experimental results.

As discussed above, the first memory controller may select a proper copy rule from a group of predefined copy rules for generating duplicates of the predetermined system data. The predefined copy rules may comprise each combination of a way to copy the system data discussed above (for example, the first type, the second type, and a hybrid of the first type and the second type) and a way to select the memory blocks for storing the duplicates of the system data. According to an embodiment of the invention, each combination of the way to copy the system data and the way to select the memory block may be assigned with a corresponding number (that is, the number of the copy rule). After determining to use which way to copy the system data and use which way to select the memory block, the number of the corresponding copy rule may be recorded in one or more bytes of the boot code index.

According to an embodiment of the invention, as discussed above, the boot code index may comprise the information regarding the predetermined address of the predetermined system data and the number of the copy rule. The predetermined address may be the physical address of the memory device. For example, an address latch enable (ALE) address, and the number of the copy rule may be a serial number.

According to an embodiment of the invention, the second memory controller may determine addresses of the memory device for storing the duplicates of the predetermined system data according to the copy rule and/or the predetermined address indicated by the boot code index, so as to read the duplicates of the predetermined system data to obtain system data that is complete and correct. For example, when the way to select the memory blocks of the adopted copy rule is related to the predetermined address, the second memory controller may determine the locations of the memory blocks utilized to store the duplicates of the system dada according to the copy rule and the predetermined address indicated by the boot code index. When the way to select the memory blocks of the adopted copy rule and the predetermined address are unrelated, the second memory controller may directly determine the locations of the memory blocks utilized to store the duplicates of the system dada according to the copy rule indicated by the boot code index.

In addition, according to an embodiment of the invention, in step S412, the second memory controller is configured to read the duplicates of the predetermined system data according to the copy rule indicated by the boot code index to obtain system data that is complete and correct. The second memory controller may use a variety of different ways to obtain system data that is complete and correct. For example, the second memory device may collect the correct pages of the system data page by page, and store the content of the obtained correct pages in the buffer memory 116. The operations can be repeated until all the correct pages of the system data have been collected. Note that the source for providing the correct page of the system data may also be the predetermined system data. That is, one or more correct pages of the system data may be collected from the predetermined system data. In another example, when the duplicates of the predetermined system data is generated according to the way to copy the system data of the first type, the second memory controller may try to find the whole system data that is complete and correct from one memory block. If there is any page that is incorrect, the second memory controller may discard this memory block and try another memory block storing the duplicates. In another example, the second memory controller may first try to find the whole system data that is complete and correct from one memory block. If the second memory controller is unable to collect the whole system data that is complete and correct within one memory block, the second memory controller may change the way to collect the system data by collecting the correct pages of the system data page by page.

As discussed above, since the memory device 120 may have undergone a high-temperature bonding procedure for being bonded to the PCB in the bonding stage, the system data stored in the memory device 120 may be damaged or lost. Therefore, in the test and classification stage, the first memory controller may select a proper copy rule for generating one or more duplicates of the predetermined system data and select one or more proper memory blocks for storing the duplicates according to the copy rule, so as to ensure that the second memory controller is able to obtain the whole system data that is complete and correct in the initialization stage. In the initialization stage, the second memory controller may try to read the original system data, that is, the aforementioned predetermined system data, according to the predetermined address indicated by the boot code index. When the second memory controller is unable to successfully read the predetermined system data, a duplicate obtaining procedure will be triggered. In the duplicate obtaining procedure, the second memory controller obtains the way to copy the system data and the addresses of the memory blocks storing the duplicates of the system data according to the copy rule (or further according to the predetermined address) indicated by the boot code index. By reading the duplicates stored in one or more memory blocks, the whole system data that is complete and correct can be obtained. After obtaining the system data, the (converted) system data is stored back in the predetermined address and the memory blocks storing the duplicates will be erased, so as to release the memory space. In this manner, not only can the second memory controller obtain complete and correct system data, but the duplicates of the system data will also not take up any more of the available memory space. Therefore, by applying the proposed data processing method, not only can the initialization procedure of the memory device be finished rapidly and successfully, but the problem of reduced of memory space due to the need of the duplicates of the system data can also be avoided.

Use of ordinal terms such as "first", "second", "third", etc., in the claims to modify a claim element does not by itself connote any priority, precedence, or order of one claim element over another or the temporal order in which acts of a method are performed, but are used merely as labels to distinguish one claim element having a certain name from another element having the same name (but for use of the ordinal term) to distinguish the claim elements.

While the invention has been described by way of example and in terms of preferred embodiment, it is to be understood that the invention is not limited thereto. Those who are skilled in this technology can still make various alterations and modifications without departing from the scope and spirit of this invention. Therefore, the scope of the present invention shall be defined and protected by the following claims and their equivalents.

What is claimed is:

1. A data storage device, comprising:
 a memory device, comprising a plurality of memory blocks; and
 a memory controller, coupled to the memory device and configured to access the memory device, wherein the memory controller is further configured to perform an initialization procedure to initialize the memory device, in the initialization procedure, the memory controller is configured to read a boot code index stored in the memory device and to try to read predetermined system data from a predetermined address indicated by the boot code index,
 wherein when the memory controller is unable to successfully read the predetermined system data from the predetermined address, the memory controller is further configured to perform a duplicate obtaining procedure to obtain system data that is complete and correct from one or more duplicates of the predetermined system data, and wherein the boot code index is further utilized to indicate a copy rule, and the memory controller is further configured to determine addresses of the memory device for storing the one or more duplicates of the predetermined system data according to the copy rule or the predetermined address, and read the one or more duplicates of the predetermined system data to obtain the system data that is complete and correct, and wherein after obtaining the system data that is complete and correct, the memory controller is further configured to convert data format of the obtained system data and store the converted system data back in the predetermined address.

2. The data storage device as claimed in claim 1, wherein after obtaining the system data that is complete and correct, the memory controller is further configured to store the obtained system data back in the predetermined address.

3. The data storage device as claimed in claim 1, wherein the memory controller is further configured to erase the one or more duplicates of the predetermined system data stored in the memory device.

4. The data storage device as claimed in claim 1, wherein the system data comprises information regarding size of the memory device and essential information required for accessing the memory device.

5. An access device, comprising:
a memory controller, coupled to a memory device and configured to access the memory device,
wherein the memory controller is further configured to perform a test procedure on the memory device to obtain a test result, configured to write a boot code index, which indicates a predetermined address for storing predetermined system data of the memory device and a copy rule adopted for generating one or more duplicates of the predetermined system data, in the memory device, and
wherein the memory controller is further configured to establish system data of the memory device according to the test result, write the system data into the predetermined address as the predetermined system data, and store the system data in one or more memory blocks of the memory device as the one or more duplicates of the predetermined system data according to the copy rule, and
wherein the copy rule is that content of a predetermined page of the system data is stored in one memory block, and pages comprised in the memory block are all written with the content of the predetermined page.

6. The access device as claimed in claim 5, wherein the system data comprises information regarding size of the memory device and essential information required for accessing the memory device.

7. A data processing method for processing data of a memory device, comprising the following steps performed by a first memory controller:
performing a test procedure on the memory device to obtain a test result;
writing a boot code index in the memory device, wherein the boot code index indicates a predetermined address for storing predetermined system data of the memory device and a copy rule adopted for generating one or more duplicates of the predetermined system data;
establishing system data of the memory device according to the test result;
writing the system data into the predetermined address as the predetermined system data; and
storing the system data in one or more memory blocks of the memory device as the one or more duplicates of the predetermined system data according to the copy rule, and the data processing method further comprising the following steps performed by a second memory controller:
performing an initialization procedure to initialize the memory device,
wherein the step of performing the initialization procedure to initialize the memory device further comprises:
reading the boot code index stored in the memory device and trying to read the predetermined system data from the predetermined address indicated by the boot code index to obtain the system data that is complete and correct,
wherein when the second memory controller is unable to successfully read the predetermined system data from the predetermined address, the data processing method further comprises:
determining addresses of the memory device for storing the one or more duplicates of the predetermined system data according to the copy rule or the predetermined address indicated by the boot index; and
reading the one or more duplicates of the predetermined system data to obtain the system data that is complete and correct, and
wherein after obtaining the system data that is complete and correct, the data processing method further comprises:
converting data format of the obtained system data; and
storing the converted system data back in the predetermined address.

8. The data processing method as claimed in claim 7, wherein after obtaining the system data that is complete and correct, the method further comprises:
storing the obtained system data back in the predetermined address.

9. The data processing method as claimed in claim 7, wherein the system data comprises information regarding size of the memory device and essential information required for accessing the memory device.

* * * * *